United States Patent [19]

Shifrin et al.

[11] Patent Number: 4,677,740
[45] Date of Patent: Jul. 7, 1987

[54] FORMING MONOLITHIC PLANAR OPTO-ISOLATORS BY SELECTIVE IMPLANTATION AND PROTON BOMBARDMENT

[75] Inventors: Gordon A. Shifrin; Robert G. Hunsperger, both of Malibu, Calif.

[73] Assignee: Hughes Aircraft Company, Los Angeles, Calif.

[21] Appl. No.: 838,409

[22] Filed: Mar. 7, 1986

Related U.S. Application Data

[63] Continuation of Ser. No. 511,726, Jul. 8, 1983, abandoned, which is a continuation of Ser. No. 285,179, Jul. 20, 1981, abandoned, which is a continuation of Ser. No. 73,774, Sep. 10, 1979, abandoned, which is a continuation of Ser. No. 939,770, Sep. 5, 1978, abandoned, which is a continuation of Ser. No. 575,686, May 8, 1975, abandoned, which is a continuation of Ser. No. 375,227, Jun. 29, 1973, abandoned.

[51] Int. Cl.$^4$ .................. H01L 21/265; H01L 7/54
[52] U.S. Cl. .................. 29/576 B; 29/571; 29/569 L; 148/1.5; 148/175; 148/187
[58] Field of Search .............. 29/576 B, 569 L, 571; 148/1.5, 175, 187

[56] References Cited

PUBLICATIONS

*American Institute of Physics Handbook,* 2nd edition, McGraw-Hill, 1963, p. 5–42.

*Primary Examiner*—Upendra Roy
*Attorney, Agent, or Firm*—A. W. Karambelas; Kenneth W. Float

[57] ABSTRACT

Disclosed are novel opto-isolator devices and processes for fabricating same wherein suitable semiconductive substrates, such as galium arsenide wafers, are treated with conductivity type determining impurities in such a manner as to form radiation emitters, radiation detectors and interconnecting waveguides therein. These operative regions which form a monolithic opto-isolator have the necessary electro-optical characteristics for generating and coupling radiation from the emitter and through the waveguide coupler to the detector; and all of these regions may be integrally fabricated in a monolithic batch fabrication process. Such process may use, for example, particle implantation and masking steps, thereby ensuring high yield and low cost device fabrication.

11 Claims, 5 Drawing Figures

FORMING MONOLITHIC PLANAR OPTO-ISOLATORS BY SELECTIVE IMPLANTATION AND PROTON BOMBARDMENT

This application is a continuation of Ser. No. 511,726 filed July 8, 1983 abandoned, which is a continuation of Ser. No. 285,179 filed July 20, 1981 abandoned, which is a continuation of Ser. No. 073,774 filed Sept. 10, 1979 abandoned, which is a continuation of Ser. No. 939,770 filed Sept. 5, 1978 abandoned, which is a continuation of Ser. No. 575,686 filed May 8, 1975 abandoned, which is a continuation of Ser. No. 375,227 filed June 29, 1973 abandoned.

RELATED APPLICATIONS

Certain individual fabrication procedures which may be used within the scope of the broad process disclosed and claimed herein have been disclosed and claimed in copending applications assigned to the present assignee. One of these applications discloses techniques for forming optical waveguides by proton bombardment of GaAs and has been assigned the serial number Ser. No. 345,625, filed on Mar. 28, 1973, on behalf of the present inventors. Another related application, Ser. No. 335,966, entitled "High Energy Ion Implantation Process and Masking Method for Use With Same" was filed on Feb. 26, 1973, on behalf of R. G. Hunsperger and H. L. Garvin and discloses certain ion implantation and masking techniques which may be used within the broad scope of the process claims herein.

A third application, Ser. No. 336,679, entitled "Process For Fabricating Small Geometry Semiconductor Devices Including Integrated Optical Components" was filed on Feb. 28, 1973 on behalf of H. L. Garvin et al and discloses certain ion beam micromachining techniques which may be used in defining the mask geometries used herein.

Fourthly, an application, serial number filed concurrently herewith entitled "Integrated Optical Detector" in the name of R. G. Hunsperger et al discloses and claims a novel sub-combination of the broad device claims recited herein.

FIELD OF THE INVENTION

This invention relates generally to optically coupled radiation emitters and detectors, which are frequently referred to in the optoelectronics art as opto-isolators, or opto-couplers. More particularly, the invention is directed to a monolithic opto-isolator in which the light emitter, light detector and optical coupling medium therebetween are fabricated in a common substrate, using ion implantation planar technology.

BACKGROUND

Opto-isolators, including light emitters and light detectors which are housed in a single package, are well-known in the optoelectronics art and have been commercially available for the past few years. These devices typically include a light-emitting diode (LED), such as a discrete gallium arsenide, gallium phosphide, or gallium arsenide phosphide diode, which is encapsulated in a small package together with a discrete detector, such as a silicon photodetector. These opto-isolator devices have demonstrated their usefulness in a variety of opto-electronic applications including high performance voltage regulators, subsystem couplers, actuator switches, and in various types of logic circuits. Furthermore, these devices have replaced such time honored components as interstage transformers and relays, as well as amplifier coupling and feedback networks. Thus, the very substantial interest in and utility of these devices are manifest. Such a device is disclosed, for example, in U.S. Pat. No. 3,727,064 and in numerous other technical publications.

PRIOR ART

The above and all other prior art opto-isolators known to us have been fabricated using discrete components for the light emitter, light detector, and the light wave coupling medium therebetween. The light emitting diode (LED) is a radiation emitter which is now widely and commercially available, and similarly the silicon photodetector has the necessary spectral response for these LEDs and has also been widely available in the optoelectronics industry for a number of years. Suitable coupling media, such as a clear silicone resin, have been successfully used both to physically maintain these discrete components in a desired spatial relationship in the opto-isolator package and also to provide an adequate light coupling medium between and partial heat sink for these discrete components.

While the above discrete component-type opto-isolators have served a wide variety of useful optical coupling functions in a large number of industrial and consumer applications, the above package type construction obviously does not lend itself to the relatively high yield fabrication as do monolithic batch fabrication processes. Thus, in the past, manufacturers of these opto-isolator devices have not been able to take advantage of the cost savings which are generally available in the batch processing of wafers wherein a large plurality of devices are simultaneously fabricated in a single wafer in a sequence of wafer processing steps. Thus the substantial desirability of having available a commercially acceptable batch process for fabricating opto-isolators is also manifest.

THE INVENTION

The general purpose of the present invention is to provide a novel monolithic planar opto-isolator and associated novel processes for fabricating same. This opto-isolator possesses many of the advantages of discrete component state-of-the-art opto-isolators, while taking advantage of some of the useful high yield processing techniques inherent in state-of-the-art semiconductor planar technology. At the same time, this invention introduces to the art significant new and useful combinations of process steps which may be utilized in fabricating devices according to the invention. The above purpose is achieved in one preferred embodiment of the invention by the use of ion implantation to form a planar PN junction radiation emitter of the monolithic opto-isolator and by the use of proton implantation to form the waveguide coupler thereof. The radiation detector of this device may advantageously be formed either by ion implantation to form a PN junction detector or by suitable metal evaporation techniques to form a Schottky barrier detector.

Accordingly, an object of the present invention is to provide a novel monolithic opto-isolator and novel processes for fabricating same.

Another object is to provide an opto-isolator of the type described which exhibits a high impedance transformation between input and output circuits connected thereto.

Another object is to provide an opto-isolator of the type described which exhibits permanent and automatic optical alignment and a high optical collection efficiency between emitter and detector sections thereof.

Another object is to provide a high yield process for the batch fabrication of monolithic opto-isolators, which process features state-of-the-art advantages of planar GaAs and particle implantation technology.

Another object is to provide planar passivated GaAs monolithic opto-isolators which are relatively low in cost and reliable and durable in operation.

DRAWINGS

DESCRIPTION OF PREFERRED EMBODIMENT

Figure 1:
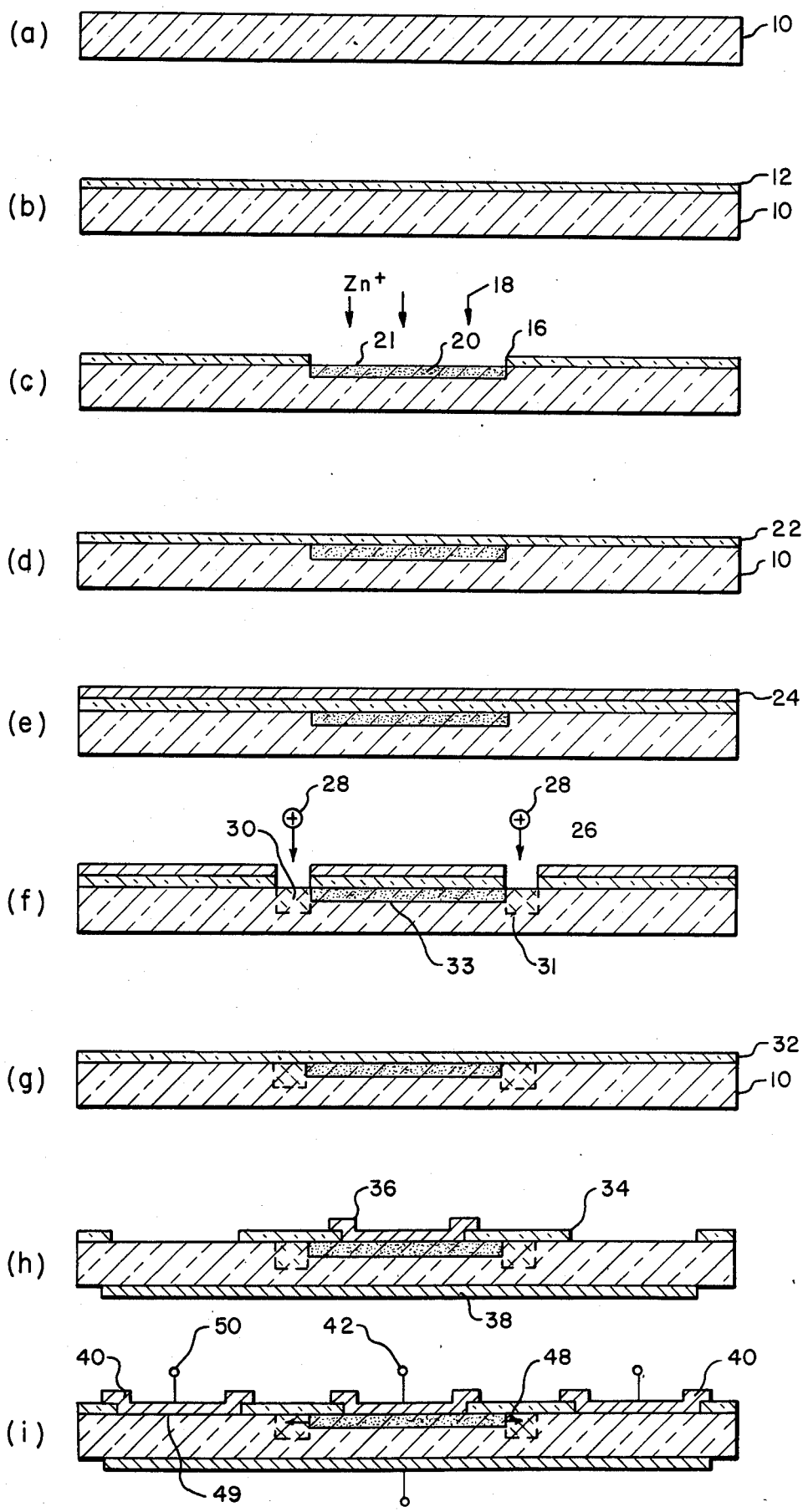
FIG. 1 illustrates a batch fabrication process sequence according to one embodiment of the invention, the resultant structure of which is a novel 3-terminal Schottky barrier detector-type opto-isolator.

Referring now to FIG. 1a, there is shown an N type gallium arsenide (GaAs) substrate 10 on the order of 10 to 15 mils in thickness and typically having a resistivity on the order of 0.01 ohm.centimeters, corresponding to approximately $10^{17}$ carriers/cc. Prior to lapping and polishing, the GaAs substrate 10 was on the order of 20 mils in thickness, and a typical process suitable for lapping and polishing the upper surface of the substrate 10 involves first an abrasive wet polishing step utilizing 0.5 micron diameter particles of aluminum oxide ($Al_2O_3$) abrasive. Thereafter, the upper surface of the GaAs substrate 10 is chemically etched using a standard commercial solution of methyl alcohol and bromine, while simultaneously rubbing the substrate with a suitable felt material. These surface cleaning steps will typically reduce the substrate thickness by 5-10 mils.

After the N type wafer 10 has been suitably etch polished as indicated, it is transferred to an oxidation furnace wherein a layer 12 of silicon dioxide is deposited thereon to a thickness of approximately 1500 to 2000 Å. The process used for this $SiO_2$ deposition step is the so called "Silox" low temperature glass deposition process wherein silane and oxygen are combined in an oxidation furnace at approximately 380° C. to yield hydrogen and silicon dioxide in accordance with the following expression:

In some instances, it may be desired to utilize a sublayer of sputtered oxide (not shown) between the GaAs substrate 10 and the deposited layer 12 in order to enhance the $SiO_2$ mask surface protection for the devices being fabricated. This may be accomplished, for example, by placing the wafer 10 adjacent to a quartz slab which itself is bombarded with high energy ions or protons to sputter the $SiO_2$ molecules from the slab onto the adjacent substrate 10.

Next, the $SiO_2$ layer 12 of the composite structure in FIG. 1b is provided with a suitable thin layer of photoresist, such as Kodak's metal etch resist (KMER) or Kodak's thin film resist (KTFR) and developed using known photolithographic ultraviolet radiation exposure and etching techniques in order to form a photoresist mask (not shown) atop the $SiO_2$ layer 12. The photoresist mask will have an opening therein corresponding to opening 16 in the $SiO_2$ mask 12. Then, by applying a preferential etchant such as hydrofluoric acid (HF) to the upper surface of the composite structure described, the silicon dioxide in the region exposed by the opening 16 in FIG. 1c is removed to thereby in turn expose a known surface area 21 of the gallium arsenide substrate 10. Alternatively, ion beam micromachining may be utilized as a means for removing the exposed oxide layer 12, and such process is disclosed in the above identified H. L. Garvin et al patent application Ser. No. 336,679.

The $SiO_2$ masked structure in FIG. 1c is then transferred to an ion implantation chamber wherein an ion beam 18 of zinc ions (Zn+) is projected through the exposed surface of the gallium arsenide wafer 10 at a particle acceleration energy of approximately 30 KeV and at a dosage of approximately $10^{16}$ atoms per square centimeter to produce to P type region 20. Thereafter, the oxide mask 12 is removed using HF and the wafer surface is then coated with another oxide layer 22 as shown in FIG. 1d using the above Silox process in preparation for annealing. The newly formed oxide layer 22 is on the order of 1500–2000 Å in thickness. The structure in FIG. 1d is transferred to an anneal furnace where it is annealed at approximately 900° C. for approximately three hours in order to provide a PN junction depth on the order of 1 micron. This depth can be varied in accordance with the anneal time and temperature used, and for an anneal time of one hour at 900° C., 0.5 micron junction depths have been achieved, whereas this depth is doubled in three hours of annealing at 900° C.

Next, a thin layer of gold is sputtered onto the upper surface of the $SiO_2$ layer 22 as shown in FIG. 1e in order to form a proton impervious masking layer 24. This gold layer 24 is typically on the order of 1–1.5 microns in thickness and is configured using ion beam micromachining techniques to form the mask geometry in FIG. 1f with the opening 26 therein. These techniques involve first forming a photoresist layer (not shown) on the surface of the gold layer 24 and then developing this photoresist layer to form a hardened photoresist mask. The latter mask has an annular opening therein through which the machining ion beams pass in order to sputter away the exposed gold regions and the oxide regions underlying these gold regions. These micromachining techniques are disclosed in the last mentioned Garvin et al application Ser. No. 336,679.

The structure in FIG. 1f is then transferred to a proton bombardment chamber wherein high energy protons 28 are projected through the mask opening 26 and into the gallium arsenide substrate 10 to form a semi-insulating annular region 30. These protons 28 are implanted at an energy of approximately 300 KeV and at a dosage of about $2 \times 10^{15}$ protons per square centimeter in order to form the 3-micron deep and 5-10 micron wide annular channel region 30. The precise width of the channel region 30 will be governed by the desire detector operating voltage and the breakdown voltage in GaAs. The latter is on the order of $5 \times 10^4$ volts per centimeter. So, to a close approximation, a 1 micron channel width can withstand 10 volts on the detector, 10 microns can withstand 100 volts, and 100 microns can withstand 1000 volts, and so on in a linear fashion. Obviously, the optical coupling efficiency of the waveguide coupling region will be decreased as the width of the channel region 30 is increased. Thus, the channel region 30 extends approximately 2 microns beneath the 1 micron deep ion implanted PN light emitting junction 33 as shown in FIG. 1f. This PN junction forms, of course, the radiation emitter of the monolithic opto-isolator described, and the semi-insulating annular waveguide region 30 forms the optical coupler between said radiation emitter and the radiation sensitive detector to be located adjacent the outside edge of the semi-insulating annular ring 30. The above proton bombardment damages the internal crystal structure of the gallium arsenide wafer 10 so as to raise the resistivity of this annular region 30 to approximately $10^8$ ohm.centimeters. Thus, the annular region 30 has an index of refraction which is substantially larger than that of the underlying substrate 10, and this substantial difference in the refractive indices of these adjacent regions provides good light reflection at the interface boundary 31. This feature tends to confine the laterally emitted PN junction radiation to the annular region 30.

After the above described proton implantation step has been completed, the structure of FIG. 1f is transferred to an anneal furnace where it is annealed from between 500° and 600° C. for approximately one hour. This anneal step does not necessarily have the effect of driving the semi-insulating region 30 to any greater depths than that already provided by the original proton implantation. But it does provide an added degree of control over the resistivity of the channel 30, and excess proton bombardment damage in the gallium arsenide can be annealed out of the crystal in this step. This excess damage causes an excess optical absorption in the waveguide coupling region. Furthermore, it may be preferred to recoat the structure with $SiO_2$ as described below with reference to FIG. 1g before carrying out the latter anneal step. Such an oxidation step would provide a higher degree of wafer surface protection during annealing if same is required.

After the completion of the proton bombardment and anneal steps illustrated and described above with reference to FIG. 1f, the oxide mask 22 and the overlying gold 24 thereon are removed by the use of an HF solution. HF has been found to etch away the $SiO_2$ layer 22 quite satisfactorily and simultaneously remove therewith the overlying gold pattern 24, without attacking the gallium arsenide substrate 10. It may be desirable to even soak the wafers 10 in HF, in which case the HF will etch the $SiO_2$ laterally beneath the gold layer 24 and thereby remove all of the surface masking 22 and 24 in less than about an hour. This metal masking removal step is described in detail in the aforementioned Garvin et al patent application Ser. No. 335,966. It should be mentioned, however, that the metallization layer 24 need not be gold, but may instead be other high atomic number (high Z) metal films, such as tungsten, which suitably adhere to the $SiO_2$ layer 22.

After the oxide and gold masking layers 22 and 24 in FIG. 1f have been removed as described, the ion and proton implanted gallium arsenide substrate 10 is returned to the oxidation furnace and, using the above Silox oxidation reaction, another layer 32 of silicon dioxide is deposited on the upper surface of the substrate 10 to a thickness in the order of 1500-2000 Angstroms. Then, using conventional photolithographic photoresist masking and etching techniques, openings 34 are formed in this new masking layer 32. Thereafter, ohmic contact metallization pads 36 and 38 are deposited as shown on the opposite sides of the substrate 10 using standard metal evaporation techniques. Once the ohmic contact metallization pads 36 and 38 are evaporated in place and are suitably adherent to the opposite surfaces of the GaAs substrate 10, the structure in FIG. 1h is transferred to an anneal furnace wherein the temperature is raised to an elevated level sufficient to cause the ohmic contact metallization 36 and 38 to become alloyed to the substrate 10 and there form good ohmic contacts.

If standard gold-germanium alloy metallization pads 36 and 38 are used, then heating this structure to an alloy temperature of approximately 450° C. for approximately two minutes will provide a very good ohmic contact at the metal semiconductor interface of the structure shown in FIG. 1h. However, there are now commercially available lower temperature metal alloys which do not require that the temperature to be raised as high as does the above gold-germanium alloy. For example, an alloy of 96% indium and 4% silver may be utilized, in which case it is only necessary to heat this ohmic contact alloy metallization (36 and 38) to approximately 156° C. in order to form a good ohmic contact at the GaAs surface. Alternatively, an alloy consisting of 75% lead: 25% indium may be utilized, in which case elevated temperatures on the order of 275° C. will suffice to provide good alloyed ohmic contacts for pads 36 and 38. A still further alternative is an alloy consisting of 98.88% lead: 0.9% indium: 0.22% gallium, which requires an anneal temperature on the order of 325° C. Thus, it may be desirable in some instances to use these lower temperature alloys described above if the 450° C. alloy temperature for the gold-germanium alloy has the effect of annealing out too much of the proton damage in the waveguide region 30. It is possible that this annealing out could undesirably lower the refractive index of this region 30 and thereby lower the interface reflectivity of this waveguide channel region.

Once the ohmic contacts 36 and 38 have been suitably formed as described above, the composite structure in FIG. 1h is transferred to a conventional metal evaporation system wherein a suitable Schottky barrier metallization, such as aluminum, is sputtered in the remaining peripheral annular opening 34 in the $SiO_2$ layer 32 to thereby form a Schottky barrier surface contact beneath the metallization 40 at the GaAs interface. Alternatively, the Schottky barrier metallization 40 may be a multi-layer metallization system (not shown) consisting, for example, of titanium, tungsten, and gold. This multi-layer metallization system is frequently preferred to a single layer of aluminum in that the titanium provides an optimum Schottky barrier contact at the gallium arsenide interface, whereas the gold provides an optimum bonding contact to external electrodes. The intermediate tungsten layer provides an excellent physical bond and thermal match between the outer layers of titanium and gold. Therefore, it is to be understood that the metallization represented at 40 is only a schematic illustration and may include two, three, or more layers of metallization.

In operation, when a suitable forward voltage is applied between input terminal 42 and common terminal 44 of the 3-terminal device in FIG. 1i, this causes a DC current to flow across the ion implanted PN light emitting junction 33. The radiative recombination of charge carriers in the vicinity of the PN junction and produced by this forward current in turn produces the radiation 48 which is coupled radially through the waveguide coupling region 30 and to the Schottky barrier 49. The coupling efficiency of the region 30 will, of course, depend upon several factors, a significant one of which is the difference in refractive indices between the region 30 and the underlying substrate 10, as previously mentioned. This photon radiation 48 received at the Schottky barrier 49 serves to generate hole-electron pairs at the reverse biased Schottky barrier 49, which in turn, will provide an increase in Schottky barrier diode current flowing through the output terminal 50 of the device and to an external load (not shown). This current may be conducted through a suitable external load resistor (not shown) to develop an output detection voltage which may then be amplified and processed in a known manner.

The gallium arsenide light-emitting PN junction 33 produces infrared radiation of approximately 9000 Angstroms wavelength when the diode is forward biased as described. This wavelength is inversely proportional to a resultant photon energy which is greater than the band gap energy of gallium arsenide. Thus, photon energy which is emitted from the PN junction 33 and efficiently coupled through the waveguide coupling element 30 is of a level sufficient to provide the above hole-electron pair generation at the Schottky barrier 49. This in turn produces the output detection current through the output terminal 50 as previously mentioned. In structures where gallium phosphide or gallium-arsenide-phosphide semiconductors are used for the N type substrate 10, the respective wavelengths of the radiation emitted from PN junctions of these alternative materials are also sufficiently short to overcome the respective bandgap energies of these materials. That is, gallium phosphide produces visible red light of about 6600 Angstroms, whereas gallium-arsenide-phosphide produces radiation wavelengths on the order of about 7000 Angstroms.

Figure 2:
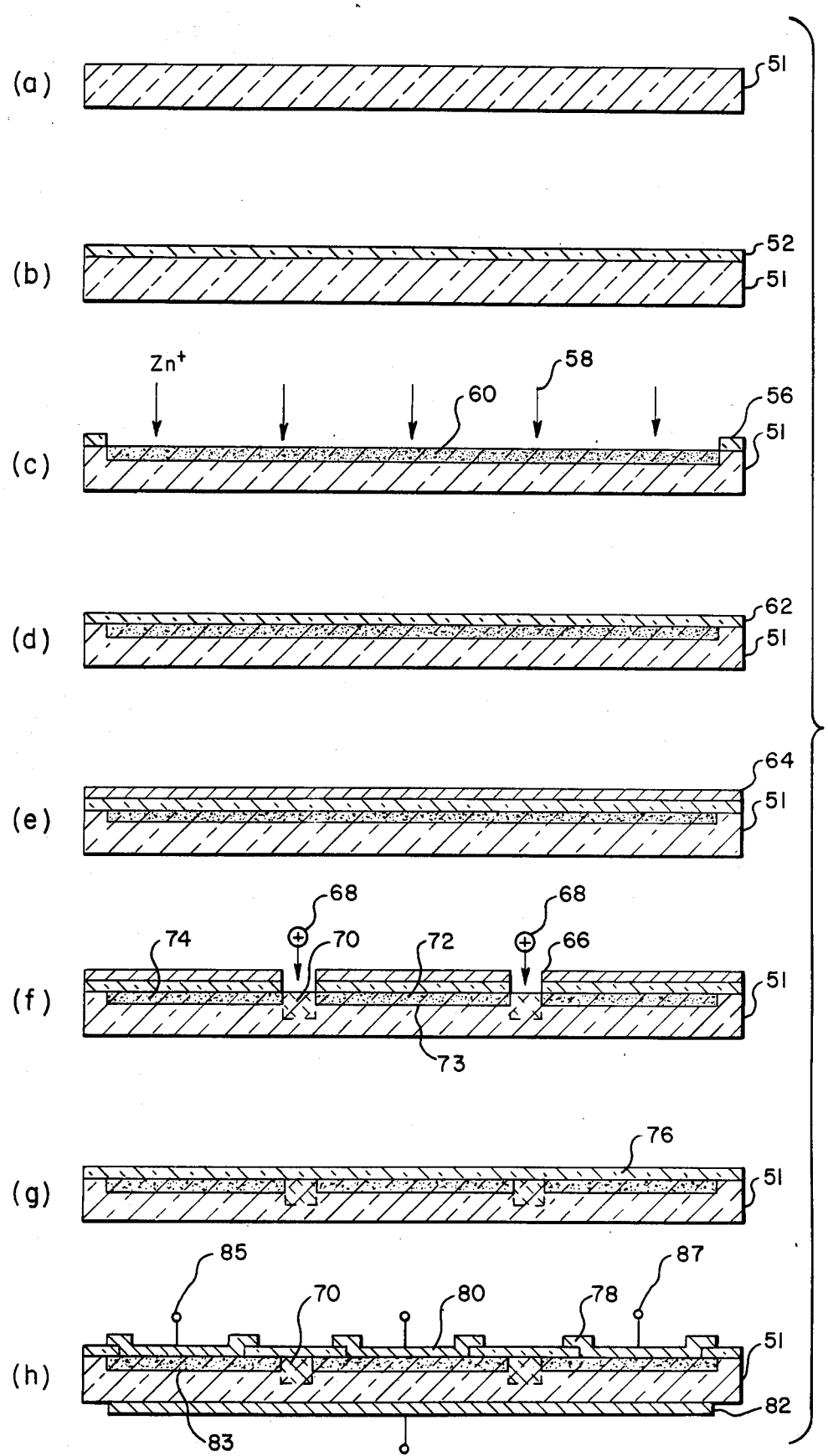
FIG. 2 illustrates another process sequence embodying the invention and differs from FIG. 1 in that an ion implanted PN junction detector is formed in the resultant 3-terminal opto-isolator structure.
Figure 3:
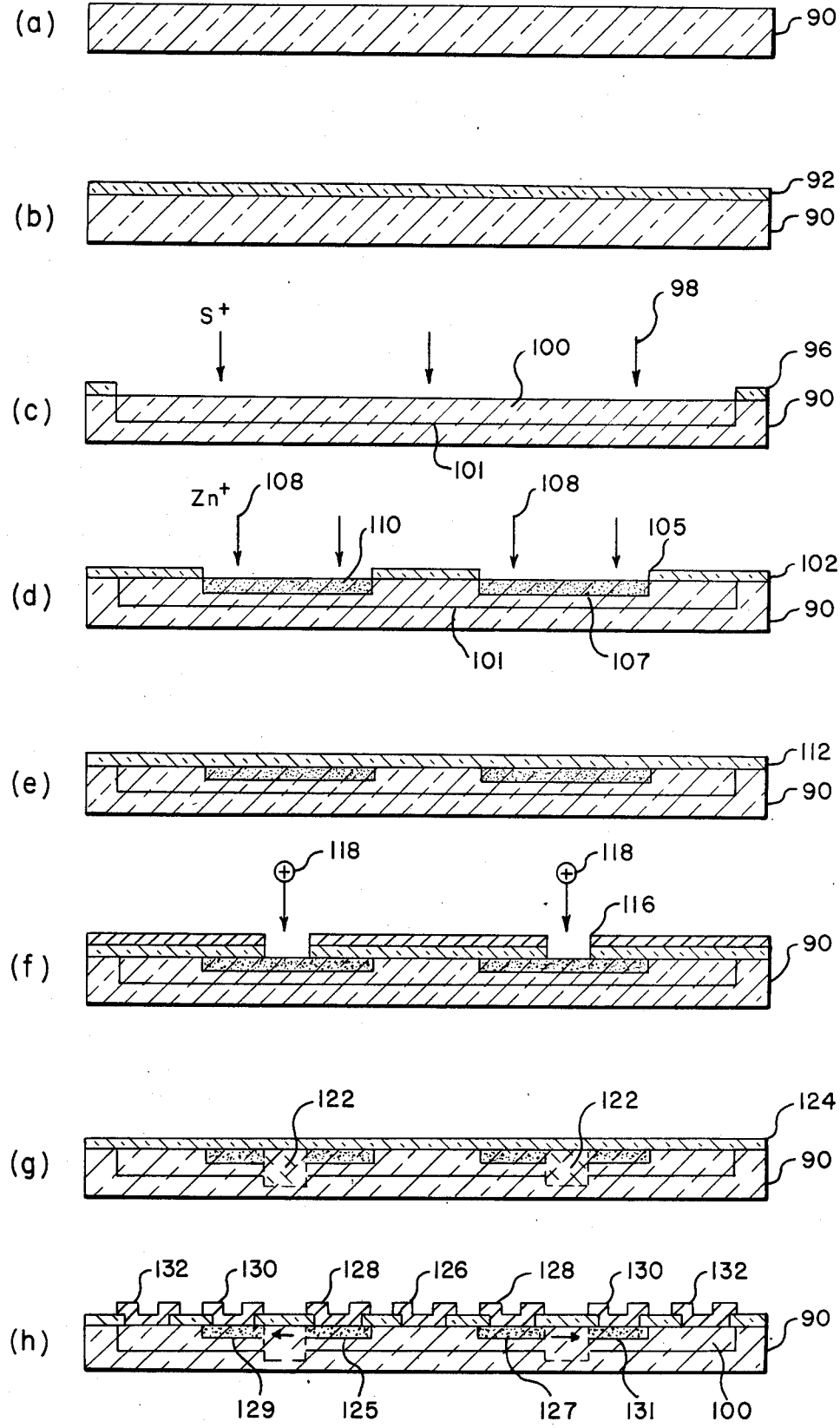
FIG. 3 illustrates a process sequence according to yet another embodiment of the invention and utilizing multiple ion implantations into a semi-insulating substrate in order to provide a high degree of electrical isolation in a novel 4-terminal opto-isolator structure.
Figure 4:
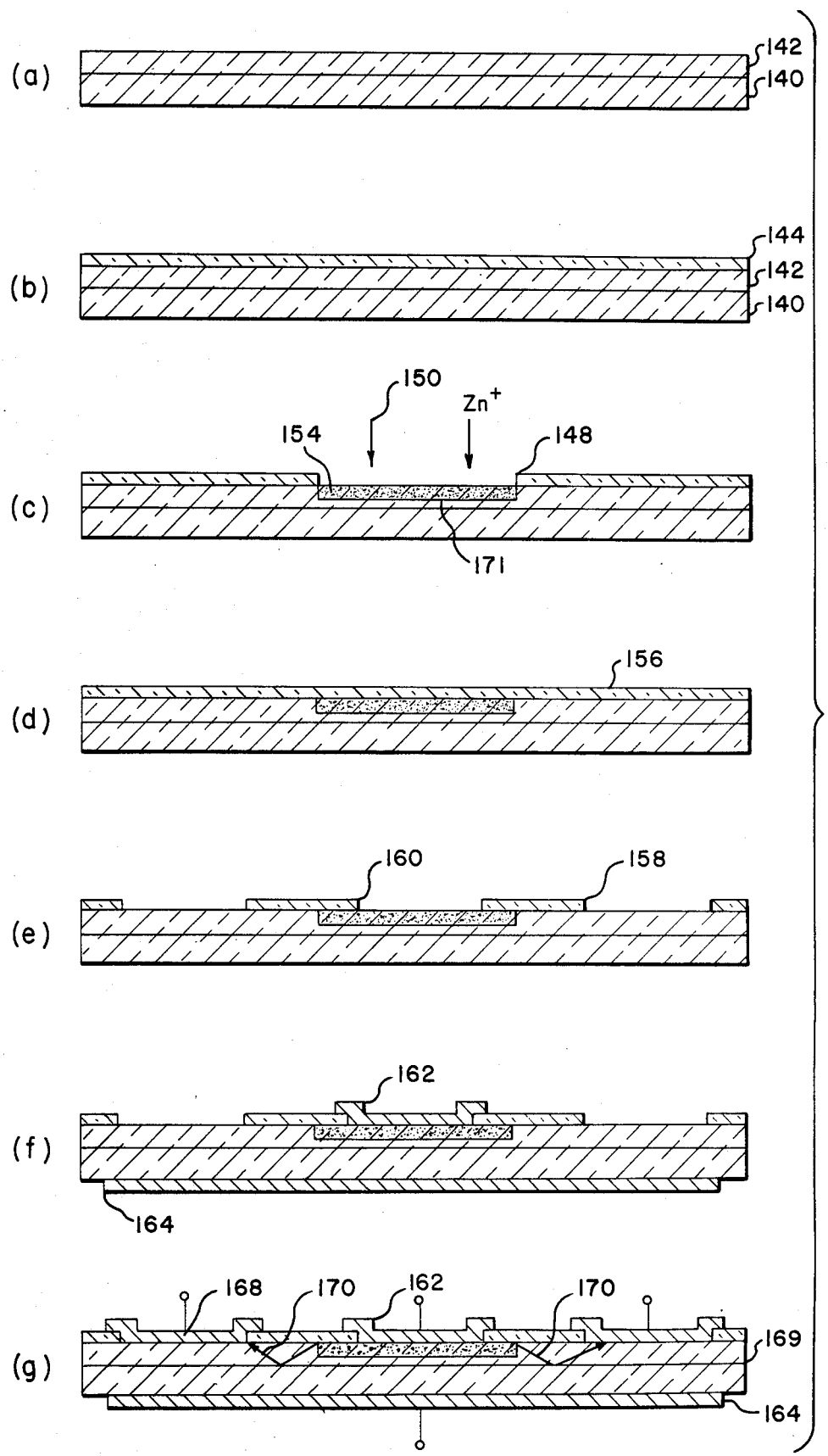
FIG. 4 illustrates another process sequence according to yet another embodiment of the invention and includes an epitaxial waveguide coupler (as contrasted to the proton bombarded waveguide couplers for the devices of FIGS. 1, 2, and 3 above) between the emitter and detector of the device.
Figure 5:
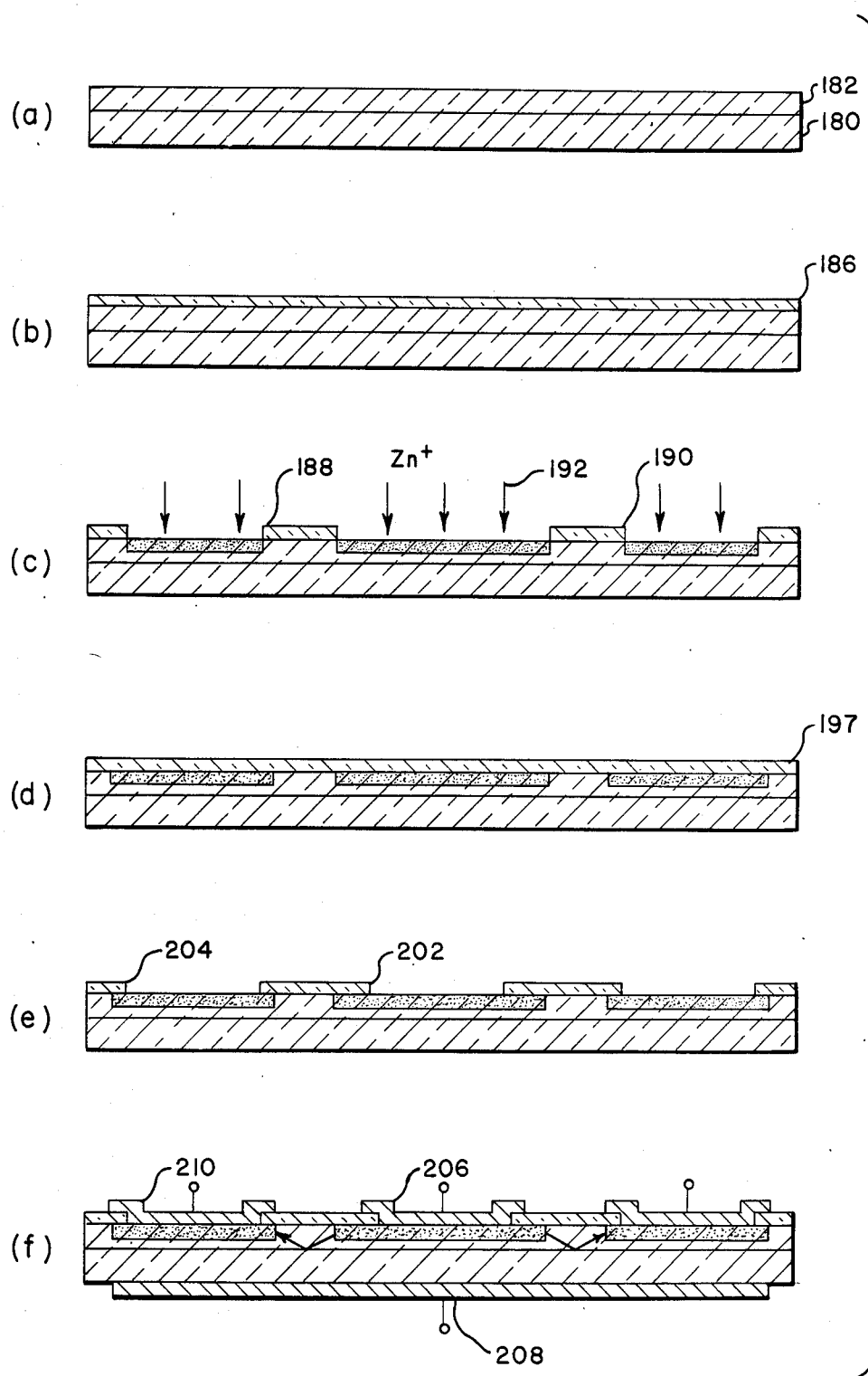
FIG. 5 illustrates another process sequence according to the invention, and differs from FIG. 4 in that an ion implanted PN junction detector is formed in the novel monolithic epitaxial opto-isolator structure.

Referring now to FIG. 2, some of the process detail for this figure and common to FIG. 1 above will be omitted in the description of this figure, as well as in the description of FIGS. 3 through 5. Steps such as oxide formation, etching, polishing, etc. are common to these figures and are generally well known in the art. However, in situations where the particle implantation parameters differ from the ones described above, characteristics such as energy and dosage will be specifically noted.

In FIG. 2 the 10-15 mil substrate starting material 51 is gallium arsenide and has a resistivity on the order of about 0.01 ohm.centimeter.

The GaAs substrate 51 is then transferred to an oxidation furnace wherein a layer 52 on the order of 1500 to 2000 Angstroms of $SiO_2$ is formed using the above described Silox process. Thereafter, the composite structure in FIG. 2b is suitably processed using known photolithographic (photoresist masking and etching) techniques to provide a relatively large area opening 56 therein as shown in FIG. 2c. High energy positive ions 58 are then accelerated into the structure in FIG. 2c to form the implanted region 60 therein. Preferably, these ions are positive $Zn^+$ ions which are accelerated in a conventional ion implantation chamber to penetrate the exposed upper surface of the structure in FIG. 2c under the influence of a particle acceleration voltage on the order of 30 KeV. The implantation dosage is typically $10^{16}$ ions per square centimeter, producing the P type region 60, and the PN junction depth reached after a subsequent annealing step is approximately 1 micron.

The latter annealing step is achieved preferably after the removal of the oxide masking 52 using an HF solution, as is well known, and after the subsequent deposition of another oxide layer 62, again utilizing the above described Silox process. This oxide layer 62 is shown in FIG. 2d and is also typically on the order of 1500-2000 Angstroms. The structure in FIG. 2d is annealed at approximately 900° C. for approximately three hours in order to achieve the above mentioned one micron PN junction depth for the $Zn^+$ implanted junction.

After the annealing of the structure in FIG. 2d has been completed, this structure is transferred to a gold evaporation chamber wherein a thin layer 64 of gold on the order of 1-1.5 microns is deposited as shown in FIG. 2e. This gold layer is, of course, for the purpose of providing a proton implantation mask which is capable of withstanding higher particle energies than the previously described $SiO_2$ mask 52 used for the relatively low energy $Zn^+$ ions. This gold masking for the proton implantation step is the same as that used above in developing the masked structure in FIG. 1f wherein photoresist and ion beam micromachining techniques were utilized. After this mask development to form the opening 66 is completed, high energy protons 68 are projected into and beneath the exposed surface areas of the structure in FIG. 2f to form the approximately 3 micron deep semi-insulating proton damaged region 70. This is an annular region and extends as shown approximately 2 microns beneath the previously formed PN junction 73. Typically, a 300 KeV particle accelerating voltage and a dosage of $10^{15}$ protons per square centimeter will be used for this step.

The structure in FIG. 2f is then transferred to an HF etchant solution wherein the Silox $SiO_2$ mask layer 62 and the overlying gold 64 thereon are removed as previously described, and thereafter the structure is transferred to an oxidation furnace wherein another layer 76 of $SiO_2$ is deposited as shown in FIG. 2g, also using the above Silox process. Once the structure in FIG. 2g has been oxidized to a thickness of 1500-2000 Å, this structure is transferred to an anneal furnace wherein the previous proton implantation is annealed from between 500° and 600° C. for approximately one hour. The new oxide layer 76 not only protects the surface of the structure in FIG. 2g during annealing, but it is subsequently used as a permanent passivating oxide mask on the 3-terminal monolithic opto isolator illustrated in FIG. 2h.

After annealing, the oxide layer 76 in FIG. 2g is developed using standard photolithographic techniques to provide the openings therein as shown in FIG. 2h, and since all metallization contacts in FIG. 2h are ohmic contacts, the metallization members 78 and 80 and 82 shown in FIG. 2h can be deposited in a single metallization process. After the latter process has been completed, the structure in FIG. 2h is transferred to a furnace to alloy the metallization contacts 78, 80 and 82 into the GaAs substrate at a predetermined alloy temperature which is dependent upon particular metallization used. As previously mentioned, the alloy temperature required depends upon the particular metallization used, and in the present embodiment in FIG. 2h, a gold-germanium alloy metallization may be used and heated to an alloy temperature on the order of 450° C. for approximately 2 minutes.

In operation, the opto-isolator illustrated in FIG. 2h is functionally identical to that of the opto-isolator previously described with reference to FIG. 1i. The PN detector junction 83 formed by the zinc implantation step in FIG. 2c is operated under reverse bias conditions, whereas the light emitting PN junction 73 is operated under conditions of forward bias during actual operation of this device. Thus, radiation which is emitted from the PN junction 73 passes radially through the approximately $10^8$ ohm.centimeter semi-insulating and waveguide coupling region 70 and is received with a relatively high coupling efficiency in the vicinity of the reverse biased detecting junction 83. The radiation received generates hole-electron pairs in the vicinity of the PN junction 83, and this in turn produces an output detection current at the output terminals 85 and 87 when the latter are connected to an external load (not shown). Thus, the process illustrated above with reference to FIG. 2 is in many respects similar to that previously described with reference to FIG. 1, and differs from the latter in that PN junction detectors, rather than Schottky barrier detectors, are formed on the outer periphery of the structure.

It should be understood, however, that, if desired, the respective positions of the PN junction emitters and detectors described above may be reversed, so that the detectors occupy the central portion of the structure and the emitters occupy the periphery of the structure. It is believed that the optical efficiency of this suggested alternative structure is not as great as the optical efficiencies of the structures shown in FIGS. 1i and 2h, above, and the reason for this is that the peripheral PN light emitting junction proposed would lose a substantial amount of radiation through its outer annular boundary to the outside world. However, it is entirely possible that means, such as a suitable reflector adjacent the PN junction light emitter, could be devised to prevent such loss of radiation in this suggested alternative structure.

Referring now to FIG. 3a, the gallium arsenide N-type substrate 90 starting material is a high resistivity chromium-doped substrate which is used especially for the purpose of making the four terminal opto-isolator to be described. The $10^7$–$10^8$ ohm.centimeter resistivity of this substrate 90 is substantially higher than the 0.01 ohm.centimeter resistivity of the previously described substrates 10 and 51 in FIGS. 1 and 2. The chromium-doped substrate 90 is commercially available from a number of suppliers and typically, the chromium is added to the melt from which the GaAs single crystals are pulled. Chromium serves to create deep level traps in the semiconductor band gap and to trap out electrons and thereby raise the resistivity of the pulled crystal to the order of $10^7$–$10^8$ ohm.centimeters, which corresponds to a carrier concentration of approximately $10^9$ carriers per cc.

Using the same lapping and polishing techniques as previously described above with reference to FIG. 1, the surface of the wafer 90 is lapped and polished to a thickness on the order of 10–15 mils. Thereafter, a thin layer 92 of $SiO_2$ (1500–2000 Å) is deposited on the surface of the wafer 90 as shown in FIG. 3b using the above Silox process. Then the $SiO_2$ layer 92 is masked with a suitable photoresist and subsequently etched using standard photolithographic techniques to thereby form the relatively wide area opening 96 as shown in FIG. 3c. The oxide thickness of this initial $SiO_2$ mask in FIG. 3c must be sufficiently thick to provide an adequate impervious barrier to the initial high energy sulphur ion implant used to form the deep implanted N type region 100 indicated in FIG. 3c. An oxide thickness on the order of 6000 Å will suffice for this mask 92. This sulphur implant is carried out typically at an approximately 600 KeV particle acceleration voltage and an ion dosage of $10^{16}$ ions per centimeter squared. The depth of the sulphur implanted region 100 will be on the order of three microns after the implanted structure is subsequently annealed for approximately 900° C. This annealing step is not carried out at this time, but rather is performed after the subsequent $Zn^+$ implantation step to be described.

The structure in FIG. 3c is then etched in HF to remove the mask 92, whereafter the Silox process is again used to form another new layer 102 of $SiO_2$ on the surface of the once-implanted structure. Then the annular opening 105 is made in the $SiO_2$ mask 102 using standard photoresist making and etching steps. The structure thus formed is shown in FIG. 3d, and the openings 105 define the width of the second $Zn^+$ ion implantation geometry illustrated in FIG. 3d. The $Zn^+$ ions are indicated at 108 and are accelerated at approximately 30 KeV and at a dosage of about $10^{16}$ ions per square centimeter. This zinc implantation step is identical to the previously described zinc implantation steps. The annealing for both of the sulphur and zinc ion implantation steps is carried after the completion of the zinc implantation and after the structure in FIG. 3d has been cleaned using HF and then subsequently reoxidized as shown in FIG. 3e. The structure in FIG. 3e, with the newly formed oxide layer 112, is then transferred to an anneal furnace wherein it is annealed at approximately 900° C. for approximately three hours and then removed in preparation for the gold deposition step illustrated in FIG. 3f.

The structure in FIG. 3f is generated by the use of gold deposition, photoresist, masking, and ion beam micromachining techniques identical to those used in the gold and photoresist mask making procedures described above with reference to FIGS. 1f and 2f. Such masking procedures are used to define the width of the annular opening 116 as shown in FIG. 3f, and high energy protons 118 are projected through this opening 116 and through the previously formed PN junctions 101 and 107 to form the high resistivity waveguide coupling region 122 as indicated in FIG. 3g. The structure in FIG. 3g shows the semi-insulating region 122 which is annealed after the GaAs surface is reoxidized with layer 124 as shown. Again, the Silox process is used to deposit the oxide layer 124 on the GaAs surface prior to annealing the proton implanted regions from between 500°-600° C. for approximately one hour.

Next, the structure in FIG. 3g is masked using standard photolithographic techniques (photoresist masking and etching) to form the openings indicated in the SiO$_2$ layer 124, and a plurality of ohmic contacts 126, 128, 130 and 132 are formed, all on the upper surface of the structure shown in FIG. 3h. Advantageously, contacts 128, 130, and 132 may be of annular configuration, and no backside contact is required for this new 4 terminal opto-isolator. The forward voltage for the PN light emitting junctions 125 and 127 is applied between the center button contact 126 and the central annular contact 128. The detector junctions 129 and 131 are reverse biased by the application of a DC voltage between the intermediate annular ohmic contact 130 and the outer annular ohmic contact 132.

The deep sulphur implanted region 100 provides the necessary 4-terminal isolation for the structure in FIG. 3h, and the radiation emitted from the PN junctions 125 and 127 is coupled radially through the semi-insulating waveguide coupling annular region 122 and collected respectively by the detector PN junctions 129 and 131. It will be observed that the deep sulphur implanted region 100 extends both into surface contact with the center electrode 126 and into contact with the outside annular electrode 132, so that all bias voltages may be applied to the upper surfaces of the opto-isolator. This feature facilitates the mounting of the structure in FIG. 3h on many types of headers where backside contacts are unacceptable.

Referring now to FIG. 4, there is illustrated a sequence of process steps which may be utilized in fabricating an epitaxial Schottky barrier opto-isolator according to the invention. As in the description of FIGS. 1 and 2, the substrate starting material 140 is N-type gallium arsenide on the order of 0.01 ohm.centimeter resistivity, and an epitaxial layer 142 is deposited on the substrate 140 using one of many acceptable vapor deposition techniques for depositing GaAs on GaAs substrates. One of these processes is the so-called arsenic trichloride (AsCl$_3$) process wherein hydrogen gas is passed through arsenic trichloride to free up elemental arsenic, which in turn is combined with elemental gallium to produce gallium arsenide in the vapor phase, which is then deposited on the GaAs substrate 140. Alternatively, epitaxial GaAs wafers of the type shown in FIG. 4a may be purchased from a number of electronic material suppliers. It should be pointed out here that GaAs epitaxial layers per se have, in the past, been used for optical waveguides.

After the formation of the epitaxial GaAs layer 142, a thin layer 144 of SiO$_2$ is deposited on the upper surface of the epitaxial layer 142; and the above described Silox process may be utilized in producing the latter SiO$_2$ layer. The SiO$_2$ layer 144 is typically on the order of 1500-2000 Angstroms in thickness and a photoresist layer (not shown) is developed atop the SiO$_2$ layer 144 and processed using standard photolithographic techniques in order to form, by selective etching, an opening 148 in the SiO$_2$ layer. Zinc ions 150 are then accelerated through this opening 148 to form the zinc implanted P type region 154 using an ion acceleration voltage and dosage identical to those described above in previous processes. Subsequently, the oxide mask 144 is removed from the structure in FIG. 4c using hydrofluoric acid, and thereafter another oxide layer 156 is deposited on the surface of the GaAs zinc implanted epitaxial layer as shown in FIG. 4d. Then the structure in FIG. 4d is annealed at approximately 900° C. for approximately 3 hours.

Next, the oxide layer 156 is masked with a photoresist layer (not shown), which is developed in accordance with standard photolithographic procedures during which the openings 158 and 160 are made in this new oxide layer as shown in FIG. 4e. Thereafter, metallization contact members 162 and 164 are evaporated on the surface of the structure as shown in FIG. 1f, and this structure is then transferred to an anneal furnace wherein the metal electrodes 162 and 164 are alloyed to the respective upper and lower surfaces of the GaAs semiconductive structure in order to provide good ohmic contacts for biasing the PN light emitting junction 171.

A gold germanium alloy may be used for contacts 162 and 164 and previous alloy processing steps apply to this embodiment of the invention. Upon removal of the structure in FIG. 4f from the anneal furnace, an annular Schottky barrier metallization member 168 is deposited on the surface of the GaAs epitaxial layer and in the annular opening 158 previously made in the silicon dioxide layer 156. Thus, in the monolithic opto-isolator illustrated in FIG. 4g, the epitaxial layer-substrate interface 169 serves to confine the radiation 170 emitted from the PN light emitting junction 171 to a more or less radial path as it is propagated toward the reverse-biased Schottky barrier at the GaAs-metal interface immediately beneath the annular contact 168. The lower or backside contact 164 serves as a common terminal for both the forward voltage applied at center electrode 162 and the reverse voltage applied at outer annular electrode 168. Otherwise, the opto-isolator operation is the same as that previously described in the other Schottky barrier detector embodiments of the invention.

Referring now to FIG. 5, the sequence of process steps illustrated in this figure differs from the sequence of process steps illustrated in FIG. 4 only in that ion implanted PN junctions, rather than Schottky barriers, are utilized for the detector portion of the monolithic opto-isolator. Thus, after the epitaxial gallium arsenide layer 182 is deposited on the GaAs substrate 180, the structure in FIG. 5a is transferred to an oxidation furnace wherein an SiO$_2$ mask 186 is formed thereon in accordance with the standard Silox procedures described above. Thereafter, the SiO$_2$ mask geometry in FIG. 5c is generated, with openings 188 and 190 therein as shown, and zinc ions 192 are then implanted through these openings at approximately 30 KeV and at a dosage of approximately $10^{16}$ ions per square centimeter.

After the zinc P type implantation step illustrated in FIG. 5c, the structure therein is etched with hydrofluoric acid in order to remove the oxide masking thereon, and the etched structure is then transferred to an oxide deposition furnace in order to deposit another SiO$_2$ layer 197 as shown in FIG. 5d. This oxidation step is in preparation for a subsequent anneal step, wherein the structure in FIG. 5d is annealed for approximately 3 hours at 900° C. in order to drive the PN junctions 198 and 200 to a depth of approximately 1 micron beneath the surface of the epitaxial layer 182.

The structure of FIG. 5d is then removed from the anneal furnace and photolithographically processed using well known photoresist masking and etching techniques in order to form the center opening 202 and an annular outside opening 204 in the oxide layer 197.

Thereafter, the metallization contacts 206, 208 and 210 are evaporated on the structure as shown in FIG. 5f, using standard metal evaporation techniques, and then the structure in FIG. 5f is allowed for a predetermined time and temperature in order to provide good ohmic contacts beneath each of these metal contact pads. Previously suggested metal alloys and their required alloying temperatures may be used in the latter step.

Obviously, there are many process variations which may be made in the above described illustrative embodiments of the invention without departing from the true scope thereof. For example, the process illustrated in FIG. 5 need not be an epitaxial and ion implantation process combination, but may instead by an epitaxial and diffusion process combination wherein both the PN light emitting junction and the PN detector junctions are formed by diffusing impurities through the oxide mask into the epitaxial layer 182. Or, still another process alternative would be to mask the epitaxial layer with $SiO_2$ and with openings therein corresponding to the desired emitter and detector junction geometry, and then epitaxially grow the appropriately doped opposite conductivity GaAs on the portions of the GaAs epitaxial layer exposed by these openings to form the emitter and detector PN junctions. Then, the oxide between the junctions can be etched away using HF to leave a mesa type structure with emitter and detector PN junctions beneath epitaxial mesas. The etched out regions between mesas can then be backfilled with a suitable waveguide coupling material to reestablish the planar geometry of the emitter-waveguide-detector structure. Finally, suitable and conventional oxide masking, etching, metal evaporation, and alloying steps can be fused to complete the structure in a manner previously described.

Furthermore, the process illustrated in FIG. 3 above is not limited to the use of zinc and sulphur impurities for the P and N type ion implantations respectively, and many other impurity ions may be used. For example, other P type ions such as cadmium, beryllium and magnesuium may be used for the P implant, whereas other N type ions such as selenium, tellurium, silicon, sulphur and tin may be used for the N type implants under the proper processing conditions. All of these dopants are capable of producing PN light emitting junctions with radiation emission in the 9000–10,000 Å wavelength range. Additionally, the processes described hereinabove are not limited to the use of the Silox low temperature glass deposition process, and many instead use other low temperature glass deposition processes, such as the pyrolitic decomposition of tetraethyl/orthosilicate (TEOS).

For some variations in metals and dopants used within the scope of the broader process claims herein, the corresponding anneal and alloy steps for these dopants or metals may require temperatures which would cause one anneal or alloy step to adversely interact with another. Thus, in some cases, it may be desirable to combine or isolate some or all of the newly required anneal and alloy steps; and in the event of the latter, alterations in the disclosed process sequences are inevitable.

Another possible modification of the process and device according to the present invention involves the N type ion implantation into P type substrates.

It is also within the scope of the present invention to vary the particular annular geometries of the opto-isolator structures shown. For example, it may be preferred for certain opto-isolator applications to depart from the above described annular structures and utilize instead merely linearly spaced apart emitter, detector, and waveguide coupling regions. Of course, the annular geometries shown above tend to maximize the emitter and detector coupling efficiencies, which is very desirable for most types of opto-isolators. But it may very well be desirable to be able to dice a monolithic wafer after fabrication without cutting across closed annular regions. Thus, it may be desired, for example, to dice a particular wafer between emitter and waveguide coupling regions, or between detector and waveguide coupling regions in order to separate two-thirds of the opto-isolator structure from the other one-third thereof. This technique might very well be useful where there is a pre-existing discrete emitter or discrete detector which must be matched up with a subcombination waveguide and detector or a subcombination waveguide and emitter, respectively. Therefore, it is to be understood that these broad subcombinations are clearly within the scope of the present invention.

Another alternative geometrical configuration within the scope of the present invention is the use of a single PN junction emitter located in the center of a device in combination with a plurality of isolated detectors spaced apart around the emitter. For example, detectors (either Schottky barrier or PN junction) could be spaced 90° apart in four quadrants of the region encircling the PN junction emitter and there isolated one from another. Each detector could be coupled through a proton-bombarded and isolated optical channel to the central emitter, or isolated epitaxial channels could be provided (using the appropriate masking) between emitter and detectors. Such an alternative device could be separately biased at the individual detectors, so that the single signal propagated from the emitter could be separately processed at each detector in accordance with the particular detector voltages used.

Thus, we have disclosed a totally new semiconductor device which is capable of affecting very substantial changes in the opto-electronics industry. Furthermore, we have disclosed in detail a number of novel process combinations for fabricating our new device. In particular, the proton implantation processes disclosed and claimed herein are expected to bring about a high yield and low cost commercial batch fabrication process heretofore unknown to the opto-isolator industry.

What is claimed is:

1. A process for fabricating a planar monolithic electro-optical isolator comprising the steps of:
   (a) selecting a semiconductive substrate capable of propagating radiation;
   (b) implanting dopant ions into at least one predefined region of said substrate, which one region defines a radiation emitting region of said substrate;
   (c) annealing said substrate for a predetermined time and temperature to electrically activate the ion-implanted region thereof;
   (d) implanting protons into a second predefined region of said substrate adjacent to said radiation emitting region to define a semi-insulating region having increased electrical impedance and acceptable optical transmission characteristics;
   (e) forming a radiation detecting region in a third predefined region of said substrate adjacent to said semi-insulating region and separate from said radiation emitting region; and (f) forming metallic contacts over said radiation emitting and detecting regions to provide electrical input and output contacts.

2. The process of claim 1 wherein said step of implanting dopant ions further comprises implanting said dopant ions into said third predefined region of said substrate.

3. The process of claim 1 wherein said step of implanting dopant ions into said substrate comprises the steps of:
  (a) forming an ion implantation mask layer over said substrate having a predefined pattern of openings therein;
  (b) implanting dopant ions into said substrate through the openings in said ion implantation mask layer; and
  (c) removing said ion implantation mask layer.

4. The process of claim 1 wherein the step of annealing said substrate comprises the steps of:
  (a) forming an annealing mask layer over said substrate having a predefined pattern of openings therein;
  (b) annealing said substrate for said predetermined time and temperature to electrically activate the ion implanted regions thereof; and
  (c) removing said annealing mask layer.

5. The process of claim 1 wherein said step of implanting protons into said substrate comprises the steps of:
  (a) forming a proton implantation mask layer over said substrate having a predefined pattern of openings therein;
  (b) implanting protons into said substrate through the openings in said proton implantation mask layer; and
  (e) removing said proton implantation mask layer.

6. The process of claim 1 wherein said step of forming metallic contacts comprises the steps of:
  (a) forming an metallic contact mask layer over said substrate having a predefined pattern of openings therein;
  (b) forming metallic contacts on said substrate in the areas defined by the openings in said ohmic contact mask layer;
  (c) annealing said substrate for a predetermined time and temperature to alloy said contacts; and
  (d) removing said metallic contact mask layer.

7. The process of claim 5 which further comprises the step of annealing said proton implanted substrate for a predetermined time and temperature prior to removing said proton implantation mask layer.

8. A process for fabricating a planar monolithic electro-optical isolator comprising the steps of:
  (a) providing a radiation propagating semiconductive substrate;
  (b) forming an ion implantation mask layer over said substrate having a predefined pattern of openings therein;
  (c) implanting dopant ions into at least one region of said substrate through the openings in said ion implantation mask layer to define a radiation emitting region therein;
  (d) removing said ion implantation mask layer;
  (e) forming an annealing mask layer over said substrate having a predefined pattern of openings therein;
  (f) annealing said substrate for a predetermined time and temperature to electrically activate the ion-implanted regions thereof;
  (g) removing said annealing mask layer;
  (h) forming a proton implantation mask layer over said substrate having a predefined pattern of openings therein;
  (i) implanting protons into said substrate adjacent to said radiation emitting region through the openings in said proton implantation mask layer in order to provide a semi-insulating region having increased electrical impedance and acceptable optical transmission characteristics;
  (j) removing said proton implantation mask layer;
  (k) forming a metallic contact mask layer over said substrate having a predefined pattern of openings therein;
  (l) forming metallic contacts on said substrate in the areas defined by the openings in said metallic contact mask layer to provide a radiation detecting region in said substrate and to provide input and output contacts;
  (m) annealing said substrate for a predetermined time and temperature to alloy said contacts; and
  (n) removing said metallic contact mask layer.

9. A process for fabricating a planar monolithic electro-optical isolator including the steps of:
  (a) selecting a semiconductive substrate capable of propagating radiation;
  (b) implanting dopant ions into a first predefined region of said substrate, which first region defines a radiation emitting Pn junction in said substrate;
  (c) implanting dopant ions into a second predefined region of said substrate, which second region defines a radiation detecting PN junction in said substrate;
  (d) annealing said substrate for a predetermined time and temperature to electrically activate the ion-implanted regions thereof;
  (e) implanting protons into a third predefined region of said substrate between said radiation emitting and detecting junctions to define a semi-insulating region having increased electrical impedance and acceptable optical transmission characteristics; and
  (f) forming metallic contacts over said radiation emitting and detecting junctions to provide electrical input and output contacts;
  whereby said semi-insulating region provides for the propagation of radiation between said radiation-emitting and radiation detecting PN junctions, and provides for electrical isolation therebetween.

10. The process defined in claim 9 wherein:
  (a) said radiation-emitting and radiation detecting PN junctions are formed by a single ion implantation step in which a continuous ion-implanted PN junction is initially formed in said substrate; and
  (b) said protons are subsequently implanted through said ion-implanted PN junction to the predetermined depth and lateral extent to interrupt said ion-implanted PN junction and form a self-aligned semi-insulating region between the radiation emitting and radiation detecting junctions.

11. The process defined in claim 10 wherein, prior to the formation of said radiation emitting PN junction, said substrate is initially implanted with impurities to convert the conductivity of a portion of said substrate so that the converted substrate forms with the underlying substrate an interface boundary beneath said light-emitting and said light-detecting PN junctions to thereby enhance the optical coupling efficiency between said light-emitting and light-detecting PN junctions.

* * * * *